United States Patent [19]

Aoyama et al.

[11] Patent Number: 5,153,702
[45] Date of Patent: Oct. 6, 1992

[54] THIN FILM SEMICONDUCTOR DEVICE AND METHOD FOR FABRICATING THE SAME

[75] Inventors: Takashi Aoyama, Ibaraki; Nobutake Konishi, Hitachiota; Takaya Suzuki; Kenji Miyata, both of Katsuta; Saburo Oikawa, Hitachi; Yoshiaki Okajima, Ibaraki; Genshiro Kawachi, Hitachi; Eimi Adachi, Katsuta, all of Japan

[73] Assignee: Hitachi, Ltd., Tokyo, Japan

[21] Appl. No.: 203,935

[22] Filed: Jun. 8, 1988

[30] Foreign Application Priority Data

Jun. 10, 1987 [JP] Japan .................. 62-143131
Jun. 10, 1987 [JP] Japan .................. 62-143136

[51] Int. Cl.5 ............................................. H01L 29/04
[52] U.S. Cl. ................................. 357/59; 357/23.7; 357/4; 359/59
[58] Field of Search .............. 357/23.7, 59 D, 59 E, 357/4; 359/59

[56] References Cited

U.S. PATENT DOCUMENTS 3,969,753  7/1976  Thorsen, Jr. et al. ........... 3577/23.7
4,768,076  8/1988  Aoki et al. .................... 437/93

FOREIGN PATENT DOCUMENTS 52-045880   4/1977  Japan ..................... 357/23.7
50153433    6/1977  Japan ..................... 357/23.7
54-153583  12/1979  Japan ..................... 357/23.7
61-139056   6/1986  Japan ..................... 357/23.7

OTHER PUBLICATIONS

Onga et al., "Characterization of Polycrystalline Silicon MOS Transistors and its Film Properties", Jap. J. Appl. Physics, vol. 21, No. 10, Oct. 1982, pp. 1472-1478.
Matsui et al., "Thin-Film Transistors on Moleuclar-Beam-Deposited Polycrystalline Silicon", J. Appl. Phys., vol. 55, No. 6, Mar. 15, 1984, pp. 1590-1595.
Kramer, "Thin Film Transistor Switching Matrix for Flat-Panel Display", 1975, pp. 152-158.
Sunafa et al., "A Large-Area High Resolution-Resolution Active-Matrix Color LCD Address by a-Si TFT", Aug. 1986, pp. 1212-1216.
Troxell, Polycrystalline Silicon Thin Film Transistors on a Novel 800° C. Glass Substrate, 1986, pp. 597-599.
Mimura et al., "High Performance Low Temp. Poly Si in-Channel TFT's for LCD", 1989, pp. 351-359.
Kamins et al., "A Monolithic Integrated Circuit Fabricated in Laser Annealed Polysilicon", 1980, pp. 290-293.
Yaron et al., "Application of Laser Annealing Techniques to Increase Channel Mobility in Silicon on Sapphire Transistor", 1980, pp. 220-222.
Ghandi, *VLSI Fabrication Principle*, ©1982, pp. 10-12.

Primary Examiner—Edward J. Wojciechowicz
Attorney, Agent, or Firm—Antonelli, Terry, Stout & Kraus

[57] ABSTRACT

This invention relates to a thin film semiconductor device and a method for fabricating it, and more particularly a thin film semiconductor device suitably applicable to a display device in an active matrix system and a method for fabricating it. In this invention, the structure of a thin film semiconductor device for improving the characteristic thereof and particularly the structure relative to the dominant orientation of a poly-Si film as an active layer of a thin film transistor (TFT) is disclosed. A method for fabricating a thin film semiconductor device which is capable of forming a poly-Si film at a relatively low process temperature is disclosed. Further, a display device in an active matrix system which provided high performance and high image quality is disclosed. The poly-Si film having a dominant orientation of (111) is formed by forming a poly-Si film on the semiconductor substrate at a temperature up to 570° C. and annealing the substrate at a temperature up to 640° C.

15 Claims, 4 Drawing Sheets

THIN FILM SEMICONDUCTOR DEVICE AND METHOD FOR FABRICATING THE SAME

BACKGROUND OF THE INVENTION

This invention generally relates to a thin film semiconductor device and a method for fabricating it. More specifically, this invention relates to such a thin film semiconductor device as being suitably used in a display device in an active matrix (AMX) system and a method for fabricating it.

In recent years, polycrystalline silicon (referred to as poly-Si) has been used as a material for a thin film transistor (referred to as TFT), which is a thin film semiconductor device for a display device in an AMX system, since poly-Si provides high image quality.

Conventionally, the poly-Si has been made by means of a low pressure CVD (referred to as LPCVD) technique. As an insulating substrate in making the poly-Si, a quartz glass or a common glass plate is used. The common glass is subjected to a great limitation since it can only be used at a process temperature up to about 640° C. There have been proposed several techniques for making poly-Si of high degree of crystallinity in such a low temperature process. A first example thereof is to increase the deposition temperature to the temperature (630° C.) close to the possible highest process temperature, to provide a deposition pressure of 0.3 Torr, thereby decreasing the deposition speed of the LPCVD film so as to enhance the crystallinity of the deposited film (the total volume of the crystalline component contained in a unit volume) (For example, see Japan Display '86 Tech. Digest 3.5 (deposition temperature: 630° C.)). The second example thereof is to deposit the LPCVD film at 600° C. and enhance its crystallinity through the subsequent heat treatment at about 600° C. (For example, Japan Society for the Promotion of Science 147-th Commitee 7-th Search Report (1985, 3. 19) page 24). The third example thereof is to deposit the LPCVD film at 610° C., make it amorphous through ion implantation, and enhance its crystallinity through the subsequent heat treatment at 600° C. (For example, see the theses for 33-rd Japan Society of Applied Physics (Spring 1986) page 544 (deposition temperature: 610° C.)). The other examples are disclosed in NIKKEI ELECTRONICS 1984, 9. 10 page 211 (deposition temperature: 600° C.) and Journal of Electrochemical Society, 127, 686 (1980), 131, 676 (1984), etc.

The resultant poly-Si film provided by the techniques mentioned above is a film of a dominant (110) texture. The above methods can improve the crystallinity to a certain degree but can not provide a sufficient carrier mobility when a TFT has been fabricated.

Further, the convention display device in AMX system imvolves several problems because of insufficiency of the carrier mobility. The first problem is that a long addressing time for a peripheral driver circuit which is formed on the same substrate as the display part, is spent. This problem sets a limit to increase of the number of pixels on the display part, and limits image quality. The second problem is that the size of TFT on the display part can not be greatly reduced so that the aperture rate will not be increased, thereby providing unsatisfactory image quality.

SUMMARY OF THE INVENTION

An object of this invention is to provide the structure of a thin film semiconductor device having an improved characteristic, and more particularly to provide the structure related with the preferred orientation of a Poly-Si film used for an active layer of TFT.

Another object of this invention is to provide a method for fabricating a thin film semiconductor device which is capable of forming the thin film at the process temperature of about 640° C. or less.

Still another object of this invention is to provide a display device in an active matrix (AMX) system which is capable of providing high performance and high image quality.

A feature of this invention resides in the dominant orientation (111) of the Poly-Si layer constituting TFT which is a semiconductor device formed on an insulating substrate (e.g. glass substrate).

Another feature of this invention resides in that the Poly-Si layer is deposited at the temperature of 570° C. or less through LPCVD and subsequently the deposited film is heat-treated at the temperature of 640° C. or less.

Still another feature of this invention resides in that the semiconductor device having, as an active layer, the Poly-Si film of the dominant orientation of the (111) orientation constitutes at least one of the active devices of the peripheral driver circuit part and the display part of a display device in an active matrix (AMX) system.

The above and other objects, features and advantages of this invention will be apparent from the following detailed description of the preferred embodiment of this invention taken in conjunction with the accompanying drawings.

DESCRIPTION OF THE PREFERRED EMBODIMENTS

Figure 1A:
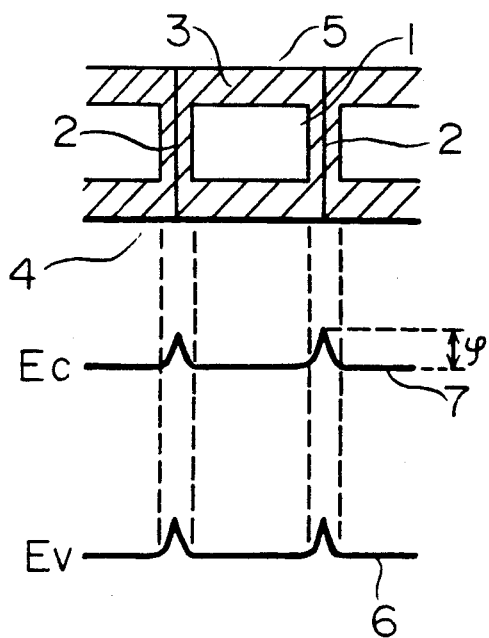
FIGS. 1A and 1B are a diagramatic view for explaining the relation between the preferred orientation and band structure in Poly-Si.
Figure 1B:
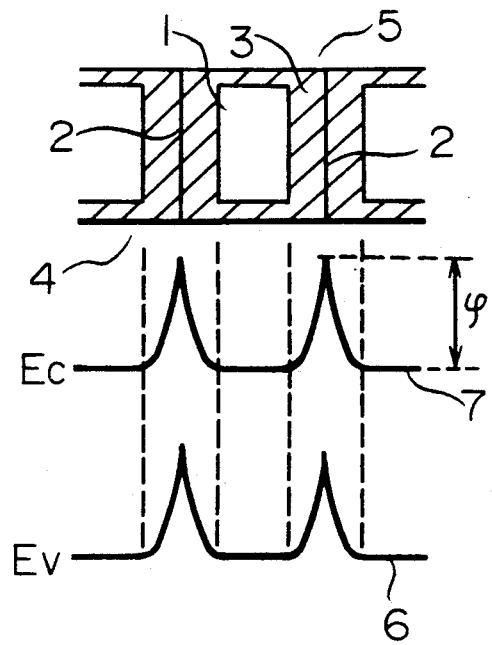

FIGS. 1A and 1B show how a depletion layer and a band structure are formed near the grain boundary of Poly-Si. FIG. 1A relates to the Poly-Si of (111) orientation and FIG. 1B relates to the Poly-Si of another orientation. In FIG. 1, 1 is a crystal grain, 2 is the grain boundary, 3 is the depletion layer, 5 is a gate oxidation film. 6 is a top energy level in a valence band and 7 is a bottom energy level in a conduction band. It is well known that the surface state density at the boundary between a single crystal silicon and the oxidation film is increased in the order of (100), (110) and (111) orientation (see Appl. Phys. Lett. 8, 31 (1966)). The idea of the surface state density applies to not only the boundary between the poly-Si surface and the gate oxidation film but also to the crystal grain boundary since the oxygen in the poly-Si segregates there. Therefore, the depletion layer width formed near the grain boundary in the direction vertical to the substrate (the vertical direction in FIG. 1) increases in the order of the (100), (110) and (111) orientation.

On the contrary, in the travelling direction of carriers (the horizontal direction in FIG. 1) the depletion layer width formed near the grain boundary decreases in the order of the (100), (110) and (111) orientation. Thus, the potential height created near the grain boundary decreases in the order of the (100), (110) and (111) orientation.

The mobility of carriers in the poly-Si depends on the height of the potential barrier created near the grain boundary. Therefore, it can be seen that the poly-Si TFT having the dominant orientation of (111) has a larger carrier mobility than the poly-Si TFT having another dominant orientation.

Embodiments of this invention will be explained below.

Embodiment 1

Figure 3:
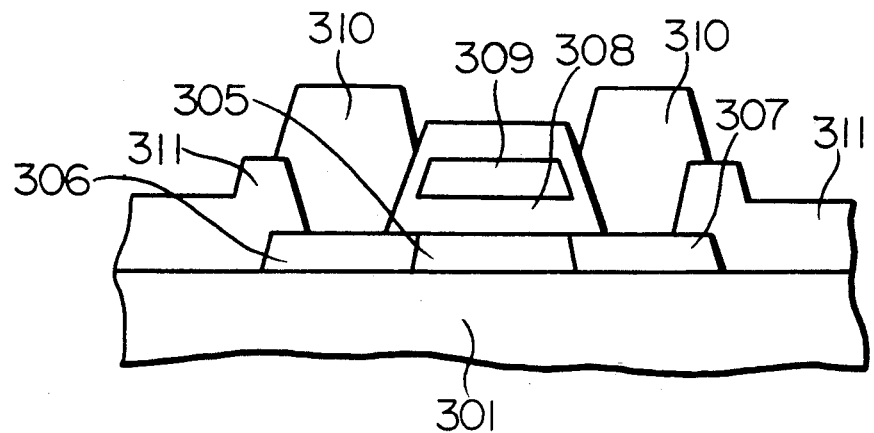
FIG. 3 is a diagramatic view showing the sectional structure of TFT according to this invention.

FIG. 3 shows the sectional structure of the entire TFT according to this invention. A substrate 301 is a glass substrate having a distortion temperature of about 640° C.

Using, as raw material, monosilane gas diluted with helium (He) into 20%, an LPCVD film 305 is deposited on the substrate maintained at 550° C. under the condition of the pressure of 1 Torr and the deposition time of 85 minutes Thus, the poly-Si film 1500 Å thick is deposited.

Next, the substrate is annealed in the atmosphere of $N_2$ gas at 600° C. during 24 hours. The dominant orientation of the poly-Si thus formed is the (111) orientation and the average grain diameter thereof is about 200 Å.

After this poly-Si is subjected to the step of an island photo-etching, an $SiO_2$ film 308, 1000 Å thick, as a gate insulation film, is deposited through atmospheric pressure CVD (APCVD).

A poly-Si film 309, 3500 Å thick, as a gate electrode, is deposited thereon at 550° C. under 1 Torr. After the gate film 309 is photo-etched, source and drain regions 306 and 307 are implanted with phosphorous (P) with the dose of $5 \times 10^{15}$ cm$^{-2}$ with the applied voltage of 30 KeV.

A passivation film 311, 5000 Å thick, of phospho silicate glass (PSG) is deposited thereon at 480° C. The device is annealed in the atmosphere of $N_2$ gas at 600° C. during 20 hours to activate the implanted regions. After openings for electric contacts are photo-etched, an alminium (Al) electrode 310, 6000 Å thick, is sputtered there. The channel width and the channel length in TFT according to this embodiment are 30 μm and 10 μm, respectively.

Figure 2:
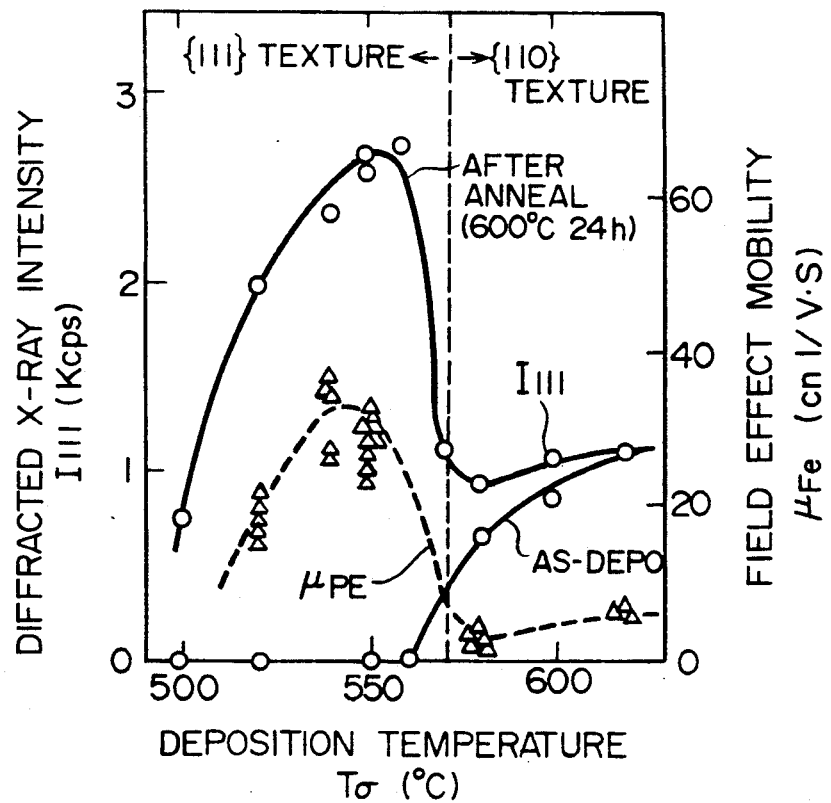
FIG. 2 is a graph showing the dependency of the crystallinity of the Poly-Si, after heat treatment, on the deposition temperature.

FIG. 2 illustrates the relation between the deposition temperature in depositing the poly-Si through LPCVD and the diffracted X-ray intensity $I_{111}$ from the (111) plane after the deposited film is annealed at 600° C. As seen from the graph of FIG. 2, if the poly-Si film is deposited at the temperature of 570° C. or less, the dominant orientation after anneal is the (111) orientation, thus providing good crystallinity to the poly-Si film. The reason is as follows. The poly-Si deposited at a temperature up to 570° C. contains almost no crystal component but mainly contains an amorphous component. During the subsequent anneal, crystal growth occurs in the solid phase from the boundary between the substrate and the deposited film and the amorphous component of the film is converted into the polycrystalline component having a dominant orientation of the (111) plane. On the other hand, if the poly-Si is deposited at a temperature above 570° C. and subsequently annealed at 600° C., the dominant orientation thereof is (110) or (311) rather than (111). Thus, the poly-Si film with the polycrystalline component having a dominant orientation of (110) or (311) is obtained.

As seen from FIG. 2, the field effect mobility at the deposition temperature of 550° C. which provides a dominant orientation of (111), which is about 30 cm$^2$/VS, is extremely larger than that at the deposition temperature of 600° C. which provides the conventional dominant orientation of (110).

The ratio of the diffracted X-ray intensity exhibited in the (111) orientation, (110) texture and (311) orientation at the deposition temperature of about 600° C. through LPCVD is about 1 to 2 to 1. As the deposition temperature is decreased, the diffracted X-ray intensity exhibited in the (111) orientation is dominant. At the temperature of about 550° C., the above ratio is about 4 to 3 to 2, thus providing a dominant orientation of (111).

Thus, the poly-Si film with the dominant orientation of (111) which has a larger field effect mobility as mentioned above can provide an excellent electrical performance when it is used as an active layer of TFT. Namely, the thin film semiconductor device with a great carrier mobility can be fabricated at the relatively low process temperature.

If a peripheral driver circuit using the poly-Si TFT having a dominant orientation of (111) providing a great carrier mobility is formed on the same substrate as the display part in the display device in an active matrix system, the number of pixels on the display part can be increased. Moreover, if such a poly-Si TFT is used for the active matrix of the display part, the aperture rate can be enhanced. In this way, in accordance with this invention, the display device using the thin film semiconductor device can realize high performance and high image quality.

The detail thereof will be concretely explained below.

Figure 8:
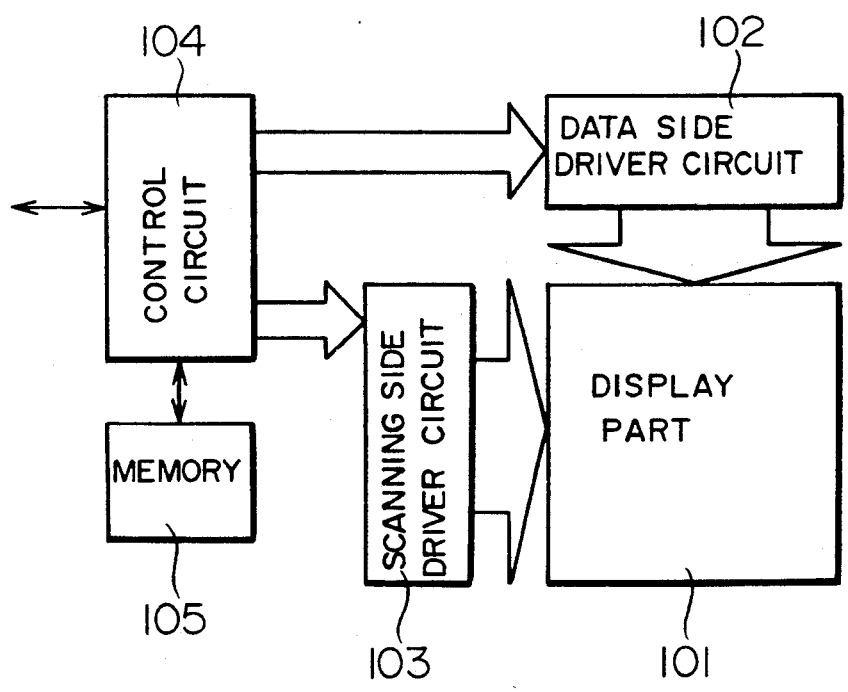
FIG. 8 is a view showing the entire structure of the display device of this invention.

FIG. 8 shows the basic arrangement of a display device using a thin film semiconductor device, such as a liquid crystal display device (LCD).

In this figure, a signal from an exterior device such as a microprocessor (not shown) is input to a control circuit 104. A display data (character data) sent from a memory 105 for storing display information, a character generator (not shown), etc. is controlled by the control circuit 104, and displayed on a display part 101 through a scanning side driver circuit 103 and a data side driver circuit 102.

Embodiment 2

It will be explained in this embodiment that if the poly-Si TFT's having a dominant orientation of (111) providing a great carrier mobility are used to constitute a peripheral driver circuit, the number of pixels on the display part can be increased.

Figure 4:
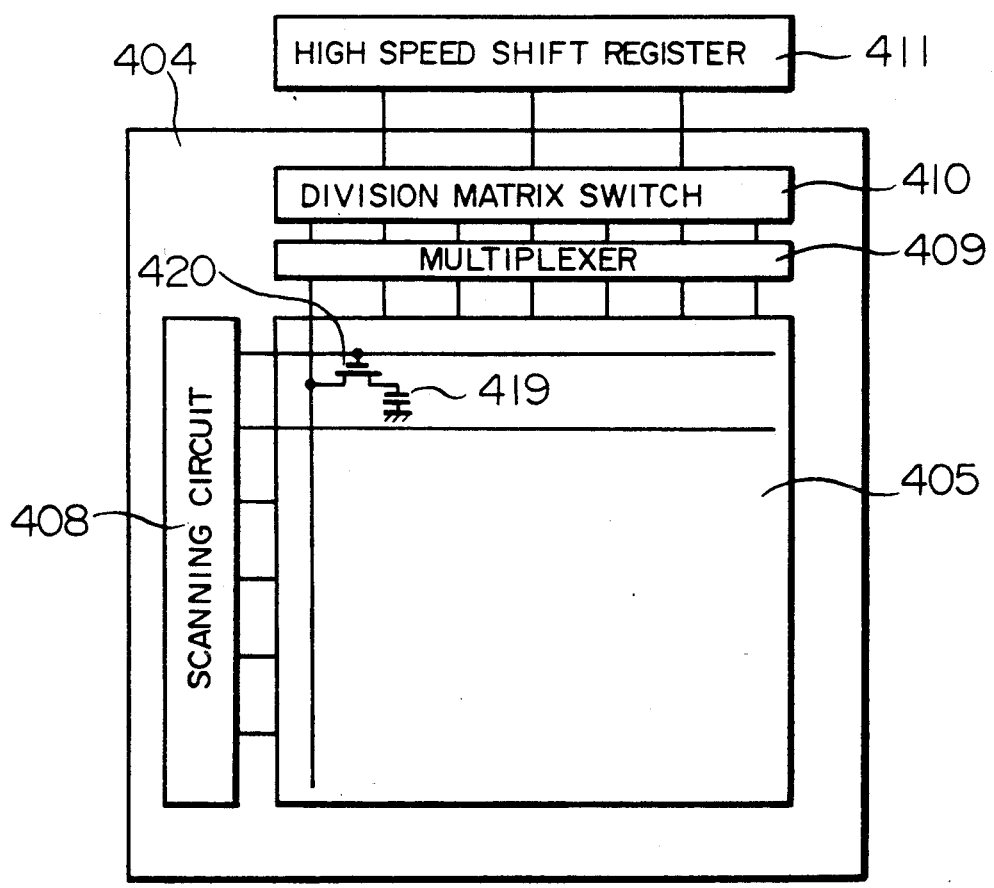
FIG. 4 is a plan view of the display device according to one embodiment of this invention.

A driver circuit for the display device, as shown in FIG. 4, is generally composed of a scanning circuit 408 and a signal circuit. The signal circuit includes a multiplexer 409, a division matrix switch 410 and a high speed shift register 411 provided externally of the substrate 404. Each of the pixels arranged on a display part 405 consists of an active device TFT 420 and a capacitor 419 which consists of a display medium, i.e. liquid crystal and pixel electrodes. These pixels are arranged in a matrix form as shown in FIG. 4. The number of pixels on the display part 405 is mainly decided depending upon the characteristics of the multiplexer 409 and the division matrix switch 410 in the signal circuit. The write time $T_{ad}$ for one pixel viewed from the signal side is represented by $$T_{ad} = \frac{1}{f_F \times N} \quad (1)$$

where $f_F$ is a frame frequency (commonly 60 Hz) and N is the number of lines on the signal side. $T_{ad}$ which is decided in the TFT characteristic in the signal circuit is commonly about 10 μsec. Now, if the signal circuit is constituted by the poly-Si TFT's having a dominant orientation of (111), $T_{ad}$ can be reduced to 1 μsec or less since the poly-Si TFT has a great carrier mobility and thus provides an excellent ON characteristic. Therefore, the number N of lines on the signal side can be increased by one order of magnitude or more. With respect to the scanning circuit 408, although the condition therefor is not more strict than the signal circuit, the clock frequency $f_{cp}$ which is a criterion of the circuit characteristic is represented by $$f_{cp} = f_p \times M \ldots \quad (2)$$

where M is the number of scanning lines. $f_{cp}$ is commonly about 10 KHz. However, if the poly-Si TFT's having a dominant orientation of (111) are used in the scanning circuit 408, $f_{cp}$ can be increased to the order of MHz. Therefore, the number of lines on the scanning side can be increased by two orders of magnitude or more. In this way, the number M×N of pixels on the display part can be increased by three orders of magnitude or more as compared with the case where this invention is not used.

Embodiment 3

It will be explained in this embodiment that if the poly-Si TFT's having a dominant orientation of (111) are used to constitute an active matrix of the display part, the aperture rate can be increased. The aperture rate, which is one of the criteria of the image quality in a display device, represents the area of the liquid crystal which can be driven by the transparent electrodes. The reason why the aperture rate is limited to a certain value is the presence of TFT and Al electrodes on each pixel. The gate width W and gate length L of TFT are commonly 50 μm and 10 μm, respectively. The gate length L is decided by the process fabricable minimum size of about 10 μm. The gate width W is decided so as to provide a sufficient ON current of TFT. If the (111) dominant orientation poly-Si TFT is adopted for each pixel, the gate width W can be decreased to 20 μm or less in the existing process fabricable minimum size. The decrease of the gate width leads to the decrease of not only a gate area but also source and drain areas. Therefore, the aperture rate can be increased from about 65% to about 75%, thereby improving the image quality on the display part. Additionally, the decrease in the TFT size also improves the yield rate thereof.

Embodiment 4

In this embodiment, explanation will be given for the structure of the poly-Si TFT having a dominant orientation of (111) and the method for fabricating it.

Figure 5:
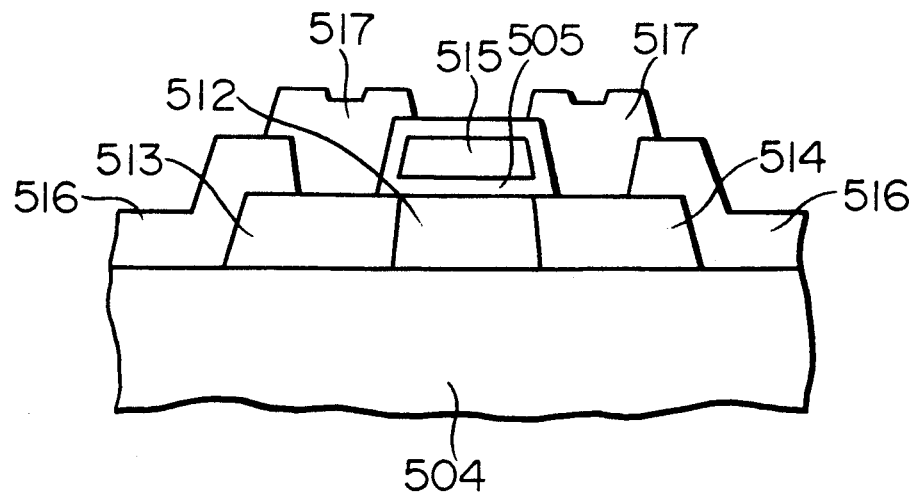
FIG. 5 is a sectional view of TFT according to one embodiment of this invention.

FIG. 5 shows the sectional structure of the poly-Si TFT having a dominant orientation of (111) used to constitute the display device shown in FIG. 4. A substrate 504 is a glass plate having a distortion temperature of about 640° C.

Using, as row material, monosilane gas diluted with helium (He) into 20%, a film 512, 1500 Å thick, is deposited on the substrate 504 maintained at 550° C. by means of LPCVD. Next, the substrate is annealed in the atmosphere of $N_2$ gas at 600° C. during 24 hours. Thus, the (111) dominant orientation poly-Si film 512 is formed. After the photo-etching step, an $SiO_2$ gate insulating film 505, 1500 Å thick, is deposited through atmospheric pressure CVD (APCVD). Thereafter, a poly-Si film 515, 3500 Å thick, as a gate electrode, is deposited. After the photo-etching step, source and drain regions 513 and 514 are implanted with phosphorous (P) with the dose of $5 \times 10^{15}$ cm$^{-2}$ with the applied voltage of 30 KeV. A phospho-silicate glass (PSG) 516, 5000 Å thick, is deposited at 480° C. The device is annealed in the atmosphere of $N_2$ gas at 600° C. during 20 hours to activate the implanted regions. After the photo-etching step for electric contacts, an aluminum (Al) electrode 517, 6000 Å thick, is sputtered. After the photo-etching step, a transparent electrode ITO (Indium Titanium Oxide), 1000 Å thick, is sputtered. After the photo-etching, finally, liquid crystal is injected between the resultant device and the other glass substrate provided with a color filter and a polarization film to complete a display device.

In this embodiment, the channel width and channel length of TFT on the display part are 20 μm and 10 μm, respectively. The number of lines on the active matrix of the display part is 660×1980. The aperture rate is 75%. Although explanation has been given for TFT 420 driving the liquid crystal constituting the capacitor 419 in FIG. 4, such TFT can, of course, be employed in the peripheral circuit, e.g. the scanning circuit 408.

Embodiment 5

Figure 6:
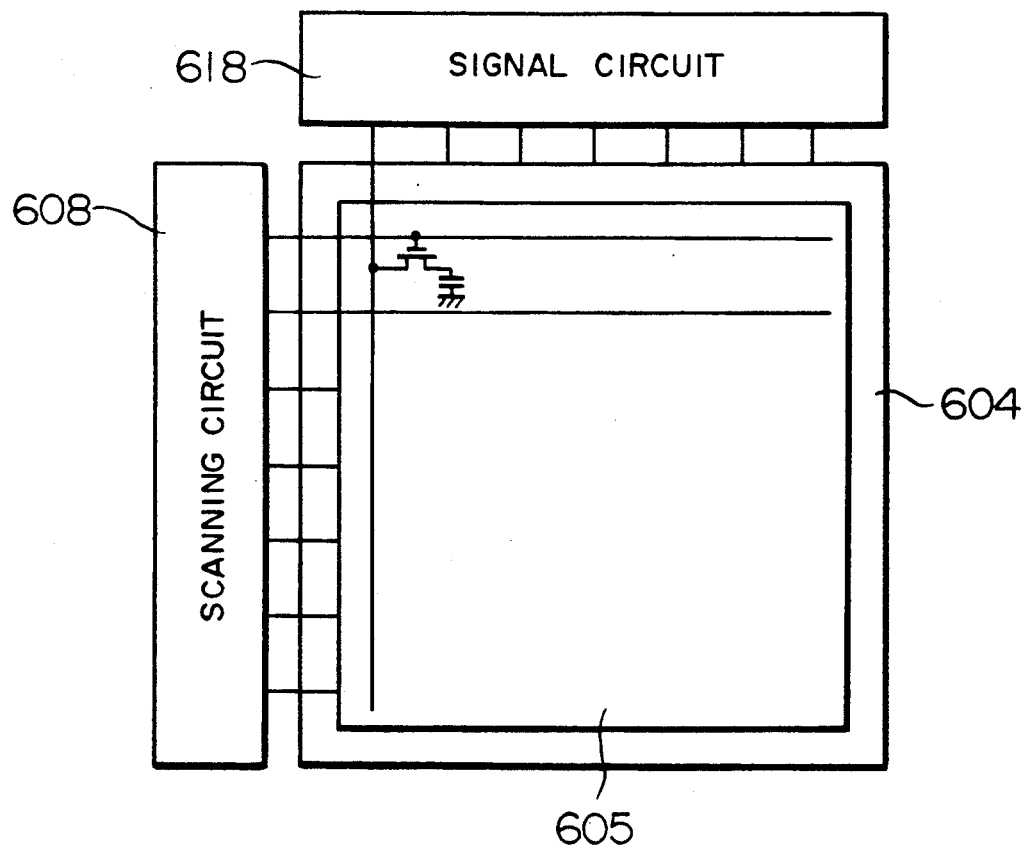
FIG. 6 is a plan view of the display device according to another embodiment of this invention.

FIG. 6 shows a display device according to another embodiment of this invention. In this embodiment, all the driver circuits each as a scanning circuit 608 and a signal circuit 618 are provided externally of a substrate 604. Then, the poly-Si TFT's each having a dominant orientation of (111) are used to constitute only the active matrix of a display part. In this way, the aperture rate can be improved from 65% to 75% as in Embodiment 3.

Embodiment 6

Figure 7:
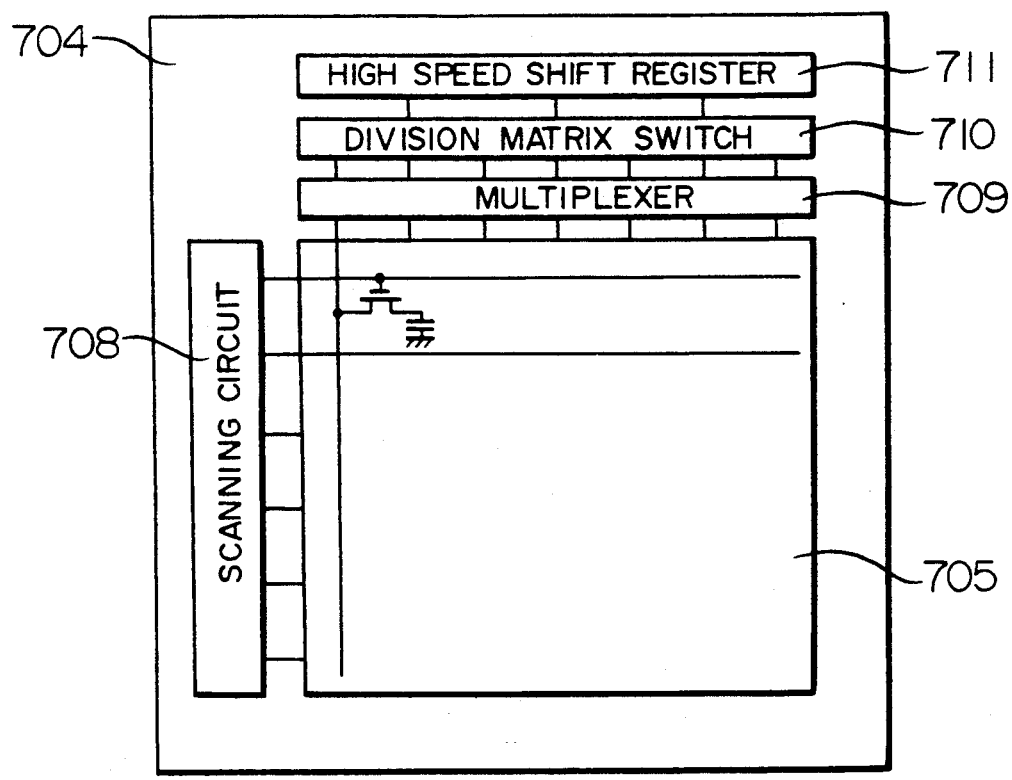
FIG. 7 is a plan view of the display device according to still another embodiment of this invention.

FIG. 7 shows a display device according to still another embodiment of this invention. In this embodiment, the poly-Si TFT's each having a dominant orientation of (111) are used to constitute a high speed shift register 711 of the signal circuit, which has been conventionally provided externally of a substrate 704. In this way, the high speed shift register 711 can also be integrated on the same substrate as a display part 705. Thus, in this embodiment, the number of connection terminals can be reduced from 177 in the prior art to 38. In the prior art, TFT having a low carrier mobility was used so that it was difficult to provide the high speed shift register 711 on the same substrate as the display part 705.

Embodiment 7

In this embodiment, the (111) dominant orientation poly-Si TFT's are used to constitute only a peripheral driver circuit. To implement this, two LPCVD layers must be formed by varying the deposition temperature of poly-Si.

First, using, as a mask, an L-shape quartz plate arranged on the region where the peripheral circuit is formed, an LPCVD film, 1500 Å thick, is deposited, on the region where TFT's are formed on the display part, under the condition of 600° C. and 0.6 Torr.

Next, using, as a mask, a square shape quartz plate arranged on the region where the TFT's are formed on the display part, another LPCVD film, 1500 Å thick, is deposited on the region where the peripheral circuit is formed under the condition of 550° C. and 0.6 Torr.

Anneal is performed at 600° C. during 24 hours. Then, the film deposited at 550° C. becomes a poly-Si film having a dominant orientation of (111) while the film deposited at 600° C. becomes a poly-Si film having a dominant orientation of (110). The following process is the same as previously mentioned. Such a display device having a dominant orientation of (111) in only the peripheral circuit has the following advantages. The peripheral circuit, which requires a high speed operation, can be driven with its size being small because of its dominant orientation of (111).

Since each of TFT's on the matrix part has a dominant orientation of (110), its size can not be reduced. Therefore, the aperture rate can not be improved either. However, the OFF current can be decreased so that a large operation margin for display partial driving by the peripheral circuit can be correspondingly taken.

The following two techniques can be adopted as a method for fabricating a display device constituted by TFT's each having a dominant orientation of (111) in only the peripheral circuit, in place of the techniques as mentioned above.

Technique 1 : n+region is formed by means of plasma CVD to omit ion-implantation.

Technique 2: All the TFT's are formed in a staggered structure in the above technique 1.

Both the techniques 1 and 2 carry out laser anneal for the peripheral circuit area.

More specifically, the gate, source, and drain regions are formed through plasma CVD. After the deposition of the poly-Si film through LPCVD, the peripheral circuit region is annealed using plasma laser with the energy density of 200 J/cm$^2$ to constitute only the peripheral circuit by TFT's each having a dominant orientation of (111).

The gate, source and drain regions which are n+(or P+) regions are formed by means of plasma CVD.

A photo-etching step is carried out to remove the n+poly-Si film corresponding to the gate region. Thereafter, an SiO$_2$ film is formed through APCVD and the n+regions are formed through plasma CVD. Further, the gate n+poly-Si is formed through a photo-etching step.

In addition to the advantages mentioned in relation to the embodiments of this invention as explained above the use of the (111) dominant orientation having high carrier mobility permits the display device to be miniaturized since the circuits which could not be integrated when the poly-Si TFT having low carrier mobility is adopted can be integrated on the same substrated.

In this way, in accordance with this invention the image quality in the display device using thin film semiconductor devices can be improved.

We claim:

1. A thin film transistor comprising a channel region, a source region and a drain region, the channel region bridging between the source and drain regions, the source, channel and drain regions being provided on an insulating substrate, a gate electrode overlying the channel region, and source and drain electrodes respectively in ohmic contact with the source and drain regions, wherein at least the channel region is made of a polycrystalline silicon film having a dominant orientation of (111).

2. A thin film transistor comprising a channel region, a source region and a drain region, the channel region bridging between the source and drain regions, the source, channel and drain regions being provided on an insulating substrate, a gate electrode overlying the channel region, and source and drain electrodes respectively in ohmic contact with the source and drain regions, wherein at least the channel region is made of a polycrystalline silicon film having a dominant orientation of (111) so as to have a larger carrier mobility than that of a thin film transistor having a channel region made of a polycrystalline silicon film with (100) or (110) dominant orientation.

3. The thin film transistor according to claim 2, wherein each of said source region, said drain region and said channel region is made of said polycrystalline silicon film having said dominant orientation of (111).

4. The thin film transistor according to claim 3, wherein each of said source region, said drain region and said channel region is formed from a single polycrystalline silicon film, having said dominant orientation of (111).

5. The thin film transistor according to claim 2, further comprising a gate oxide film between the channel region and the gate electrode, and wherein the thin film transistor is an MOS transistor.

6. A semiconductor apparatus comprising a display part and a control circuit part, the display part including pixels, each having a first thin film transistor, pixel electrodes and display medium, arranged in a matrix form, the control circuit part including second thin film transistors, for controlling the display part, each of the first and second thin film transistors comprising a channel region, a source region and a drain region, the channel region bridging between the source and drain regions, a gate electrode overlying the channel region, and source and drain electrodes respectively in ohmic contact with the source and drain regions, the source, drain and channel regions being provided on an insulating substrate, wherein, for at least one of the first thin film transistors and the second thin film transistors, at least the channel region is made of a polycrystalline silicon film having a dominant orientation of (111) so as to have a larger carrier mobility than that of a thin film transistor having a channel region made of a polycrystalline silicon film with (100) or (110) dominant orientation.

7. A semiconductor apparatus according to claim 6, wherein each of the source region, the channel region and the drain region of said at least one of the first and second thin film transistors is made of the polycrystalline silicon film having the dominant orientation of (111).

8. A thin film semiconductor apparatus according to claim 7, wherein said display part and said control circuit part are formed on a same insulating substrate, the first and second thin film transistors being formed on said same insulating substrate.

9. A semiconductor apparatus according to claim 6, wherein at least the channel region of the first thin film transistors is formed of a first polycrystalline silicon film, having a different dominant orientation than that of a second polycrystalline silicon film from which at least the channel region of the second thin film transistors is formed.

10. A semiconductor apparatus according to claim 9, wherein the second polycrystalline silicon film has a dominant orientation of (111), and the first polycrystalline silicon film has a dominant orientation different from the (111) orientation.

11. A semiconductor apparatus according to claim 10, wherein the first polycrystalline silicon film has a dominant orientation of (110).

12. A semiconductor apparatus according to claim 6, wherein the source, drain and channel regions of the first thin film transistors are formed from a first polycrystalline silicon film and the source, drain and channel regions of the second thin film transistors are formed from a second polycrystalline silicon film, the first and second polycrystalline silicon films having different dominant orientations, with one of the first and second polycrystalline silicon films having the dominant orientation of (111).

13. A semiconductor apparatus according to claim 12, wherein the second polycrystalline silicon film has a dominant orientation of (111).

14. A semiconductor apparatus according to claim 13, wherein the first polycrystalline silicon film has a dominant orientation of (110).

15. A semiconductor apparatus comprising a display part and a control circuit part, the display part including pixels, each having a first thin film transistor, pixel electrodes and a display medium, arranged in a matrix form, the control circuit part including second thin film transistors, for controlling the display part, each of the first and second thin film transistors comprising a channel region, a source region and a drain region, the channel region bridging between the source and drain regions, a gate electrode overlying the channel region, and source and drain electrodes respectively in ohmic contact with the source and drain regions, the source, drain and channel regions being provided on an insulating substrate, wherein, for at least one of the first thin film transistors and the second thin film transistors, at least the channel region is made of a polycrystalline silicon film having a dominant orientation of (111).

* * * * *